United States Patent
Pratt et al.

(10) Patent No.: US 8,927,410 B2
(45) Date of Patent: Jan. 6, 2015

(54) METHODS OF FORMING THROUGH SUBSTRATE INTERCONNECTS

(71) Applicant: Micron Technology, Inc., Boise, ID (US)

(72) Inventors: Dave Pratt, Meridian, ID (US); Andy Perkins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/100,893

(22) Filed: Dec. 9, 2013

(65) Prior Publication Data

US 2014/0099786 A1 Apr. 10, 2014

Related U.S. Application Data

(62) Division of application No. 13/248,970, filed on Sep. 29, 2011, now Pat. No. 8,629,060, which is a division of application No. 11/840,120, filed on Aug. 16, 2007, now Pat. No. 8,034,702.

(51) Int. Cl.
*H01L 21/44* (2006.01)
*H01L 21/768* (2006.01)

(52) U.S. Cl.
CPC .............................. *H01L 21/76898* (2013.01)
USPC ........... 438/597; 438/629; 438/630; 438/639; 438/640; 438/666; 438/667; 438/669; 438/670; 257/182; 257/774; 257/775; 257/621; 257/698; 257/E23.067; 257/E23.174; 257/E21.649

(58) Field of Classification Search
None
See application file for complete search history.

(56) References Cited

U.S. PATENT DOCUMENTS

| | | | |
|---|---|---|---|
| 4,603,023 A | 7/1986 | Mack et al. | |
| 4,613,888 A * | 9/1986 | Mase et al. | 257/637 |
| 5,352,921 A | 10/1994 | Codama et al. | |
| 5,425,816 A | 6/1995 | Cavicchi et al. | |
| 5,858,869 A | 1/1999 | Chen et al. | |
| 5,955,200 A | 9/1999 | Chang et al. | |
| 6,121,130 A | 9/2000 | Chua et al. | |
| 6,255,737 B1 | 7/2001 | Hashimoto | |
| 6,383,837 B1 | 5/2002 | Tsunashima | |

(Continued)

FOREIGN PATENT DOCUMENTS

| | | |
|---|---|---|
| CN | 1531027 | 9/2004 |
| CN | 201110415712.6 | 11/2013 |
| JP | 2000323605 | 11/2000 |
| KR | 1999-0082267 | 6/1998 |

OTHER PUBLICATIONS

WO PCT/US2008/070141, Jan. 29, 2009, Search Report/Written Opinion.
WO PCT/US2008/070141, Feb. 25, 2010, IPRP.

(Continued)

*Primary Examiner* — David Vu
*Assistant Examiner* — Cuong B Nguyen
(74) *Attorney, Agent, or Firm* — Wells St. John, P.S.

(57) ABSTRACT

A method of forming a through substrate interconnect includes forming a via into a semiconductor substrate. The via extends into semiconductive material of the substrate. A liquid dielectric is applied to line at least an elevationally outermost portion of sidewalls of the via relative a side of the substrate from which the via was initially formed. The liquid dielectric is solidified within the via. Conductive material is formed within the via over the solidified dielectric and a through substrate interconnect is formed with the conductive material.

16 Claims, 11 Drawing Sheets

(56) References Cited

U.S. PATENT DOCUMENTS

| | | |
|---|---|---|
| 6,475,896 B1 | 11/2002 | Hashimoto |
| 6,583,046 B1 | 6/2003 | Okada et al. |
| 6,608,389 B1 | 8/2003 | Hashimoto |
| 6,730,589 B2 | 5/2004 | Hashimoto |
| 6,828,174 B2 | 12/2004 | Katagiri et al. |
| 6,828,175 B2 | 12/2004 | Wood et al. |
| 7,030,440 B2 | 4/2006 | Huang et al. |
| 7,049,686 B2 | 5/2006 | Hashimoto |
| 7,129,567 B2 | 10/2006 | Kirby et al. |
| 7,214,615 B2 | 5/2007 | Miyazawa |
| 7,470,979 B2 | 12/2008 | Hashimoto |
| 2002/0182819 A1 | 12/2002 | Schrems et al. |
| 2003/0096449 A1 | 5/2003 | Hashimoto |
| 2003/0213981 A1 | 11/2003 | Hashimoto |
| 2004/0180486 A1 | 9/2004 | Hashimoto |
| 2005/0141168 A1 | 6/2005 | Lee et al. |
| 2006/0024966 A1* | 2/2006 | Umemoto et al. ............ 438/689 |
| 2006/0131705 A1 | 6/2006 | Hashimoto |
| 2006/0223301 A1 | 10/2006 | Vanhaelemeersch et al. |
| 2006/0228562 A1 | 10/2006 | Ukawa et al. |
| 2006/0289968 A1 | 12/2006 | Sulfridge |
| 2007/0032061 A1 | 2/2007 | Farnworth et al. |
| 2007/0045779 A1 | 3/2007 | Hiatt |
| 2007/0048994 A1 | 3/2007 | Tuttle |

OTHER PUBLICATIONS

Nhuyen, S. V., "High-density Plasma Chemical Vapor Deposition of Silicon-based Dielectric Films for Integrated Circuits", IBM Journal of Research and Development vol. 43 Nos. 1/2, 1999, 36 pages.

* cited by examiner

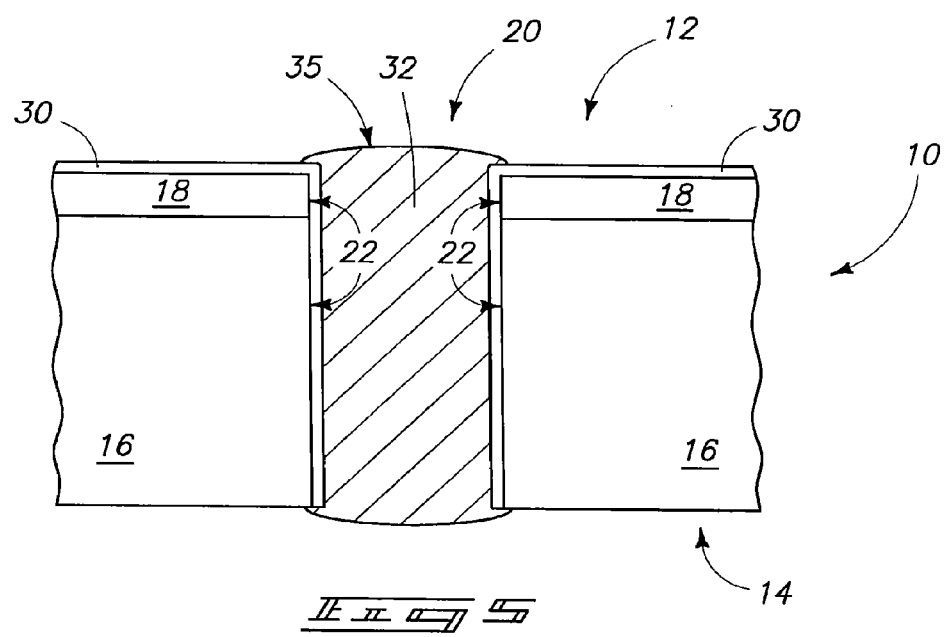
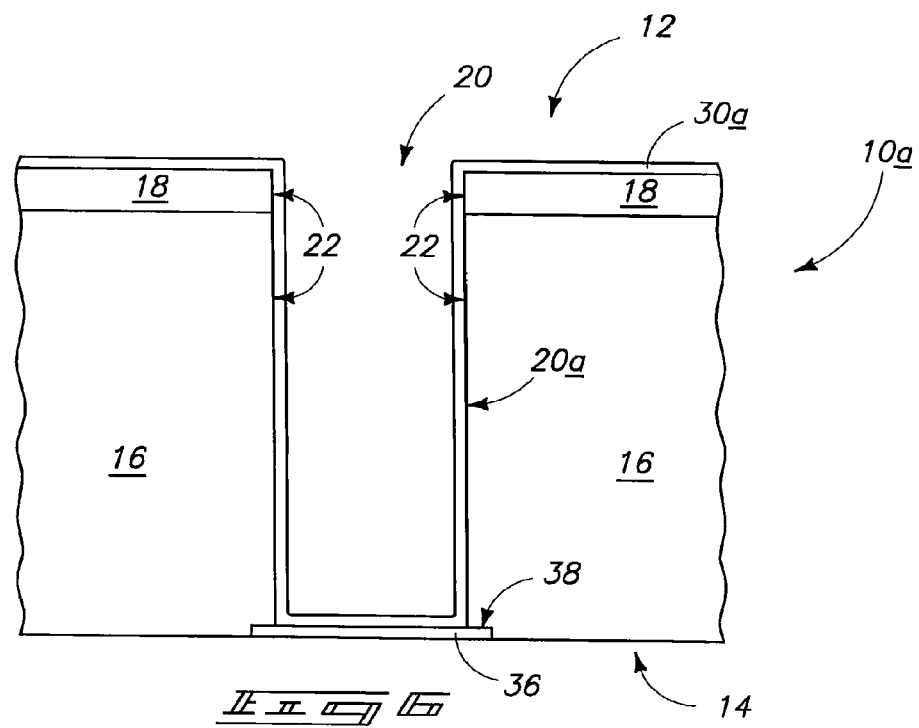

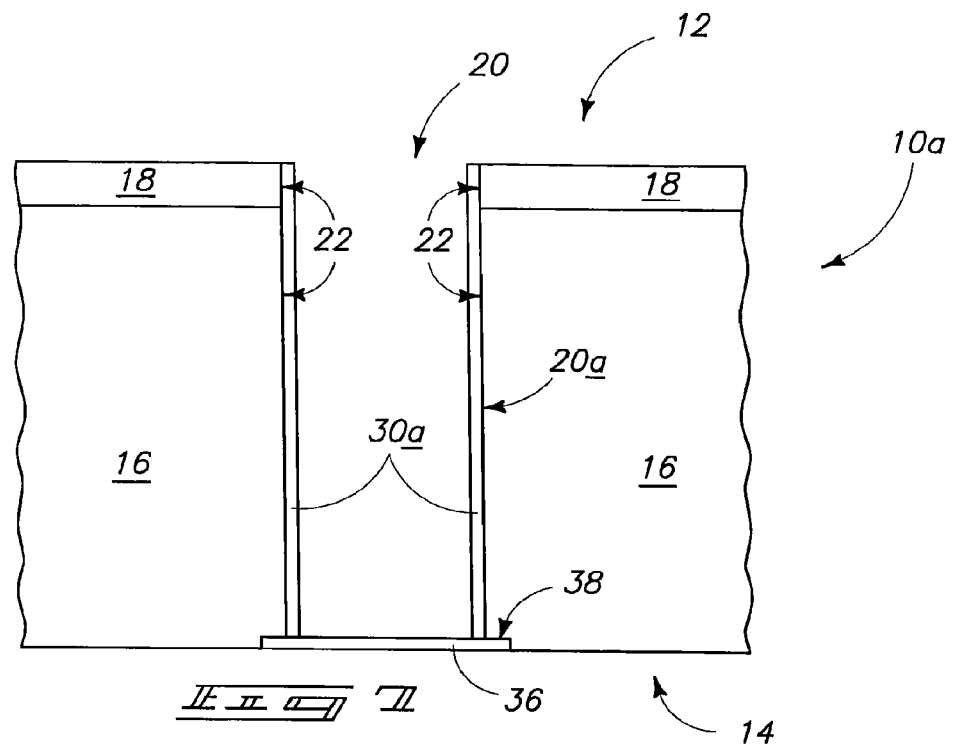
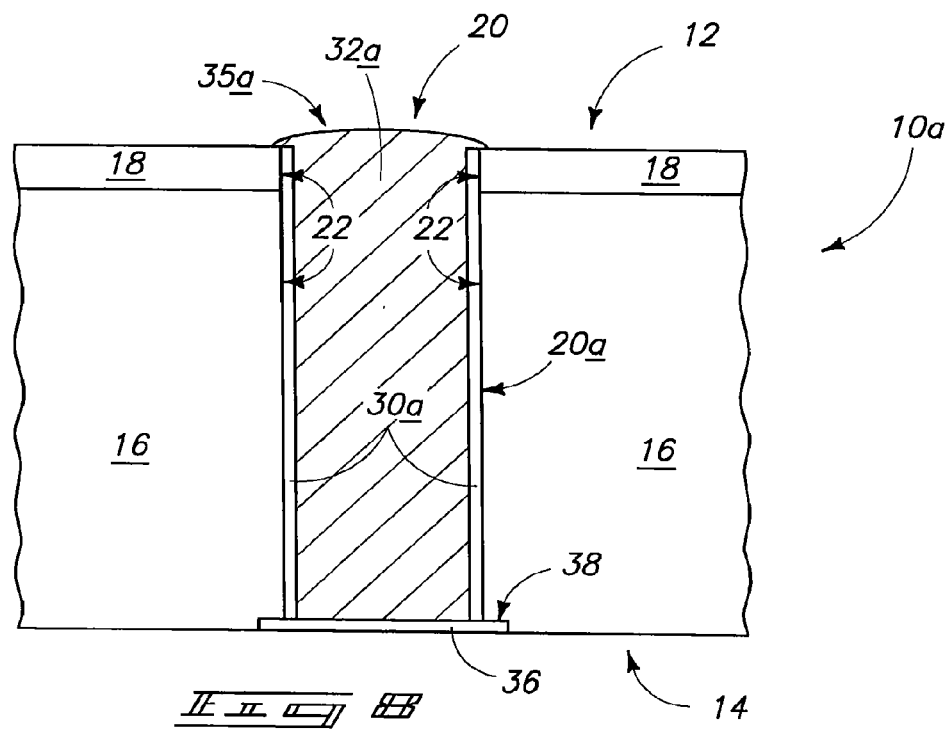

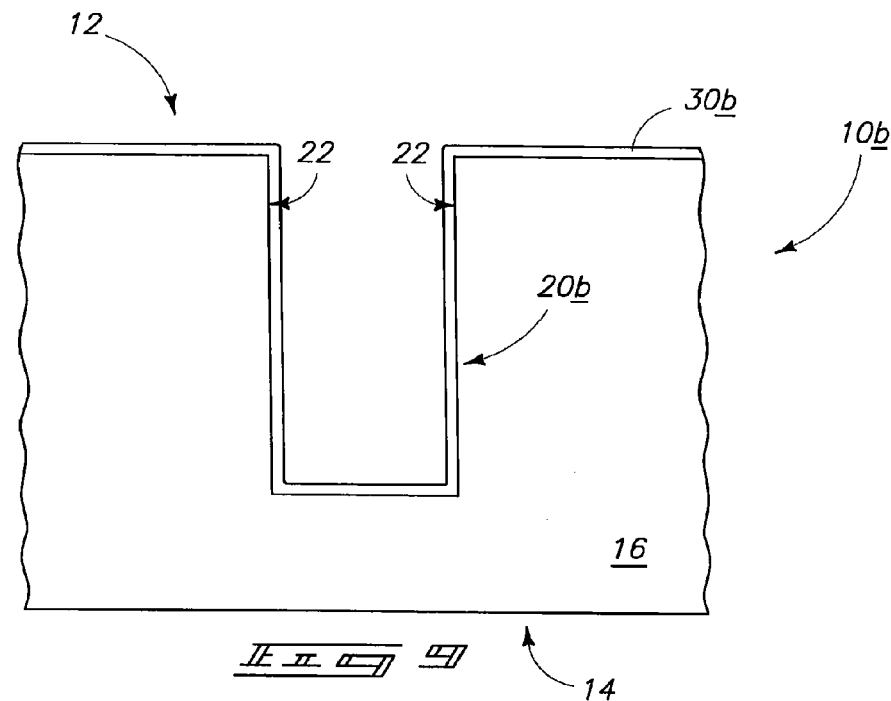
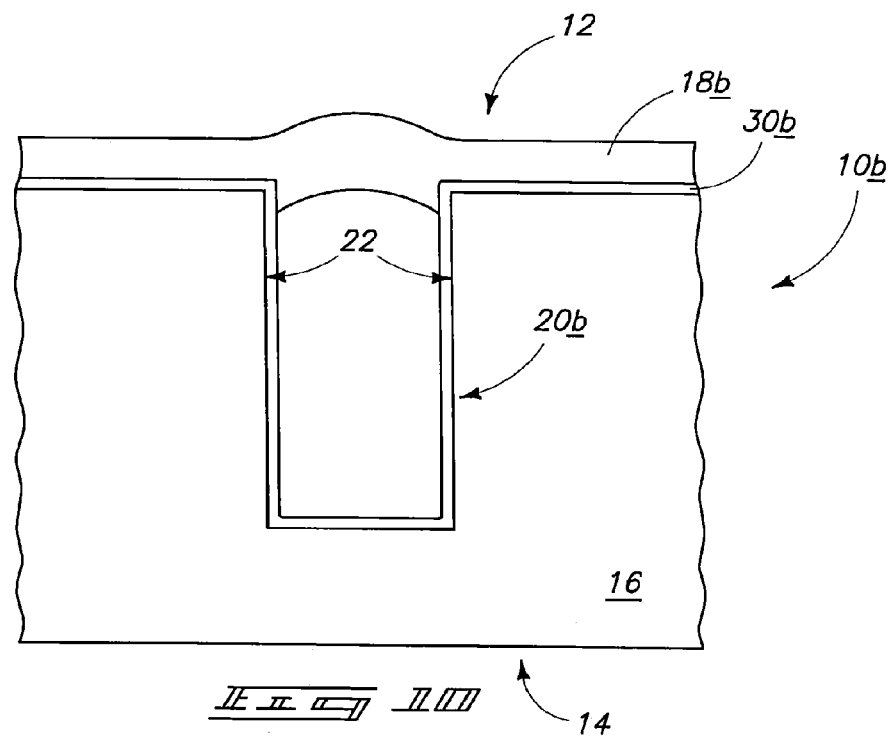

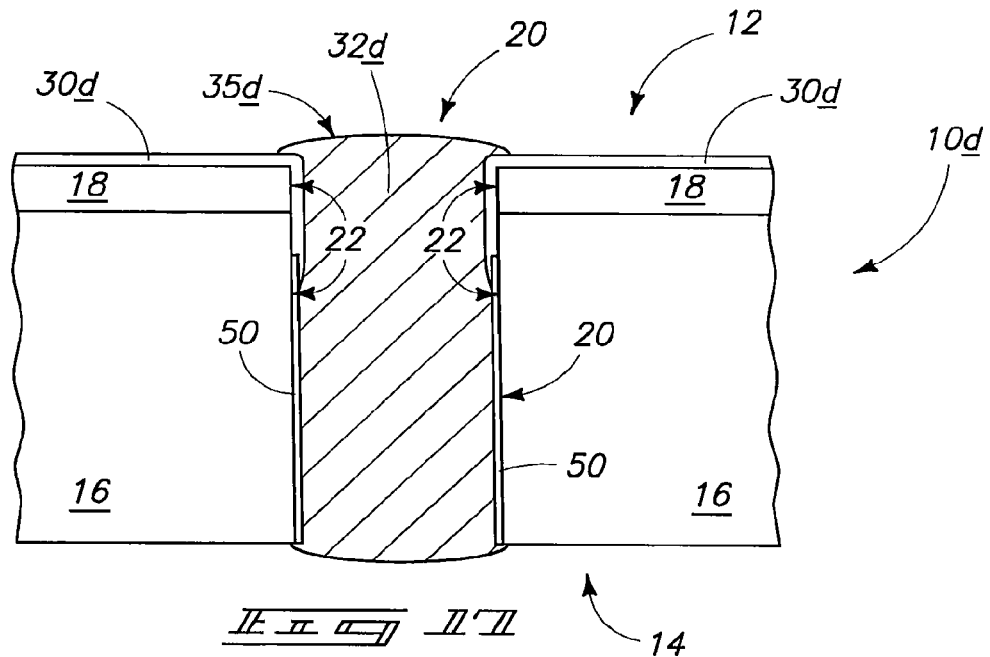
_FIG. 17_
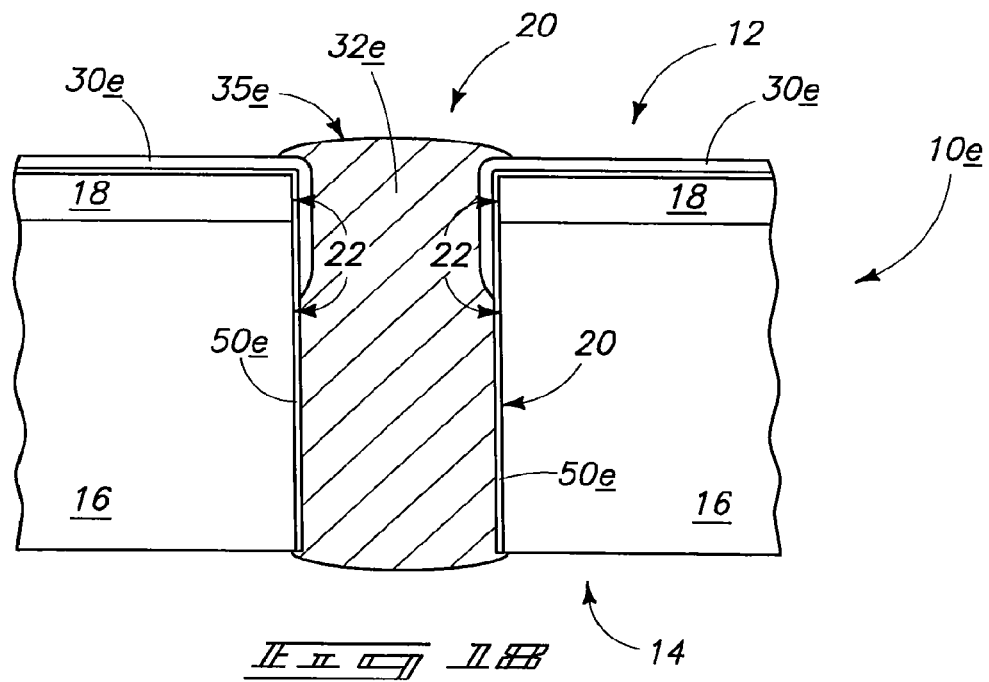
_FIG. 18_

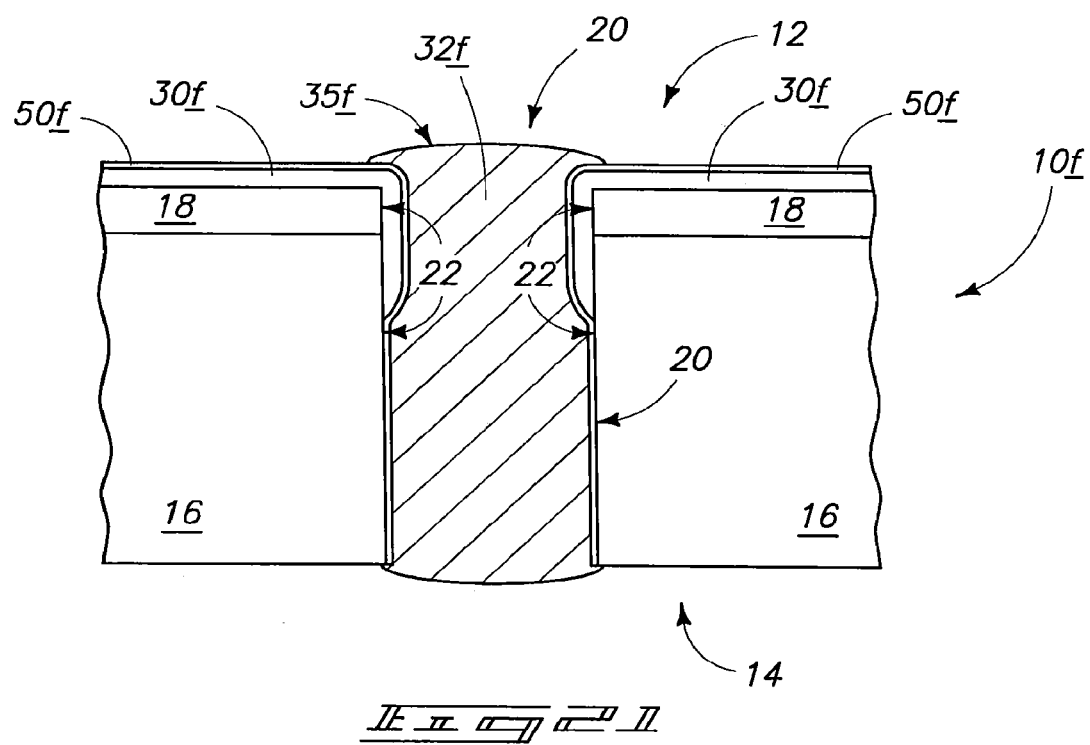

METHODS OF FORMING THROUGH SUBSTRATE INTERCONNECTS

RELATED PATENT DATA

This patent resulted from a divisional application of U.S. patent application Ser. No. 13/248,970, filed Sep. 29, 2011, entitled "Methods of Forming Through Substrate Interconnects", naming Dave Pratt and Andy Perkins as inventors, which is a divisional application of U.S. patent application Ser. No. 11/840,120, filed Aug. 16, 2007, now U.S. Pat. No. 8,034,702, entitled "Methods of Forming Through Substrate Interconnects", naming Dave Pratt and Andy Perkins as inventors, the disclosures of which is incorporated by reference.

TECHNICAL FIELD

Embodiments disclosed herein pertain to methods of forming through substrate interconnects.

BACKGROUND

Integrated circuits are commonly fabricated using semiconductor substrates. Numerous processes are used in the fabrication of the circuits, including, for example, deposition of material, etching of material, doping, photolithography, metallization, oxidation, etc. Most often, a plurality of identical integrated circuits are formed over a single substrate, commonly referred to as a wafer, to define individual circuit die. These are ultimately singulated into separated die or chips, which are then packaged. In other applications, a single wafer or other substrate might be fabricated to comprise one or more different integrated circuits, and may not be singulated. Regardless, a continuing goal in the fabrication of integrated circuitry is to make ever denser and smaller devices, and resultant integrated circuitry.

One manner of increasing density in a semiconductor assembly is to stack individual substrates, such as semiconductor die, one upon another. The stacked semiconductor die may be interconnected by forming conductive vias in through holes in one or more of the semiconductor dies, for example prior to singulation. An interior of each of the vias may be coated with an electrically insulating material followed by an electrically conductive material to electrically connect the vias to integrated circuitry fabricated on a primary circuitry side of the substrate. Thus, the conductive vias provide a conductive pathway from the primary circuitry side of a semiconductor substrate to its back-side or back-surface for conductive contact with another substrate.

The integrated circuit die, when near completion and prior to singulation, are usually provided with one or more dielectric passivation layers on one or both sides of the substrate. Such layers might provide one or more of insulative protection, stress buffering, and/or a moisture barrier to underlying circuitry. The through hole vias are then formed through the passivation layer(s) and into semiconductive and other material of the substrate. As above, in order to isolate the conductive portion of the through substrate interconnect from other portions of the substrate, the vias are lined with one or more electrically insulating materials. As the throughway for vias become narrower, it can be problematic to completely line sidewalls of such vias with dielectric material prior to forming conductive material therein. One existing manner of doing so comprises pulsed chemical vapor deposition of an aluminum oxide-comprising material. Such is deposited over the dielectric layer and into the via to line the sidewalls of the via. Differences in thermal coefficients of expansion among the aluminum oxide-comprising material, the passivation dielectric material and materials of the substrate can undesirably cause separation and cracking or one or more of these materials.

BRIEF DESCRIPTION OF THE DRAWINGS

FIGS. 2-5 illustrate a method embodiment of the invention.

FIG. 6 is a diagrammatic sectional view of another semiconductor substrate in process in accordance with an embodiment of the invention.

FIGS. 7 and 8 illustrate a method embodiment of the invention.

FIG. 9 is a diagrammatic sectional view of another semiconductor substrate in process in accordance with an embodiment of the invention.

FIGS. 10-12 illustrate a method embodiment of the invention.

FIGS. 14-17 illustrate a method embodiment of the invention.

FIG. 18 is a diagrammatic sectional view of another semiconductor substrate in process in accordance with an embodiment of the invention.

FIGS. 20 and 21 illustrate a method embodiment of the invention.

DETAILED DESCRIPTION OF EXAMPLE EMBODIMENTS

Embodiments of the invention encompass methods of forming through substrate interconnects, sometimes referred to in the existing art as through wafer interconnects. In the context of this document, a "through substrate interconnect" is a conductive interconnect extending from a back-side of a semiconductor substrate to integrated circuitry formed on or proximate a front-side of the substrate. Further in the context of this document, the "front-side" of a semiconductor substrate is that one of the two major opposing sides of the substrate (the other being the "back-side") from which the circuit components of the integrated circuitry are primarily fabricated. Further in the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
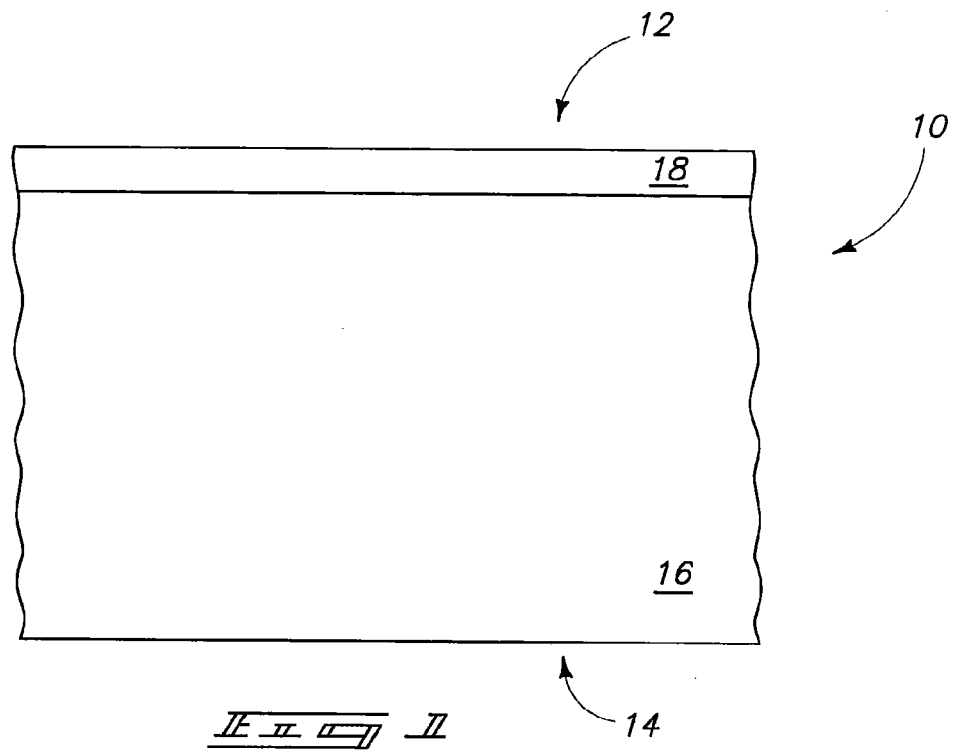
FIG. 1 is a diagrammatic sectional view of a semiconductor substrate in process in accordance with an embodiment of the invention.

Example methods of forming through substrate interconnects are initially described with reference to FIGS. 1-5. Referring to FIG. 1, a semiconductor substrate is indicated generally with reference numeral 10, and comprises a first major side 12 and a second major side 14. By way of example only, a thickness range for substrate 10 is from about 700 microns to about 800 microns. Side 12 may comprise a back-side of the semiconductor substrate and side 14 may comprise a front-side of the semiconductor substrate. Yet alternately, side 12 may comprises the front-side of the semiconductor substrate and side 14 may comprise the back-side of the semiconductor substrate. Regardless, semiconductor substrate 10 is depicted as comprising some region 16 and a passivation dielectric layer 18 has been formed thereover. In the context of this document, a "passivation dielectric" is any dielectric material formed over an outer surface of a substrate after completion of most all of the integrated circuit components. Redistribution layers and/or other conductive lines might be formed over passivation dielectric 18, and other insulating and/or passivating layers might be provided thereover as well, but regardless the vast majority of the integrated circuit devices has been fabricated inwardly of the passivation dielectric in what is generally depicted as region 16. Accordingly, region 16 will include a plurality of different materials, layers, and regions having integrated circuit components and devices (not shown) fabricated therein, including at least some semiconductive material.

FIG. 1 depicts passivation dielectric 18 being deposited onto substrate side 12. Where substrate region 16 comprises bulk semiconductor material and substrate side 12 comprises the back-side, passivation dielectric 18 has been formed over bulk semiconductive material of substrate region 16. Silicon, for example bulk monocrystalline silicon, is but one example semiconductive material. An example thickness range for layer 18 is from 1 micron to 25 microns. By way of example only, example materials for layer 18 include polyimide, polybenzoxazole, spin-on dielectric, and epoxies.

Figure 2:
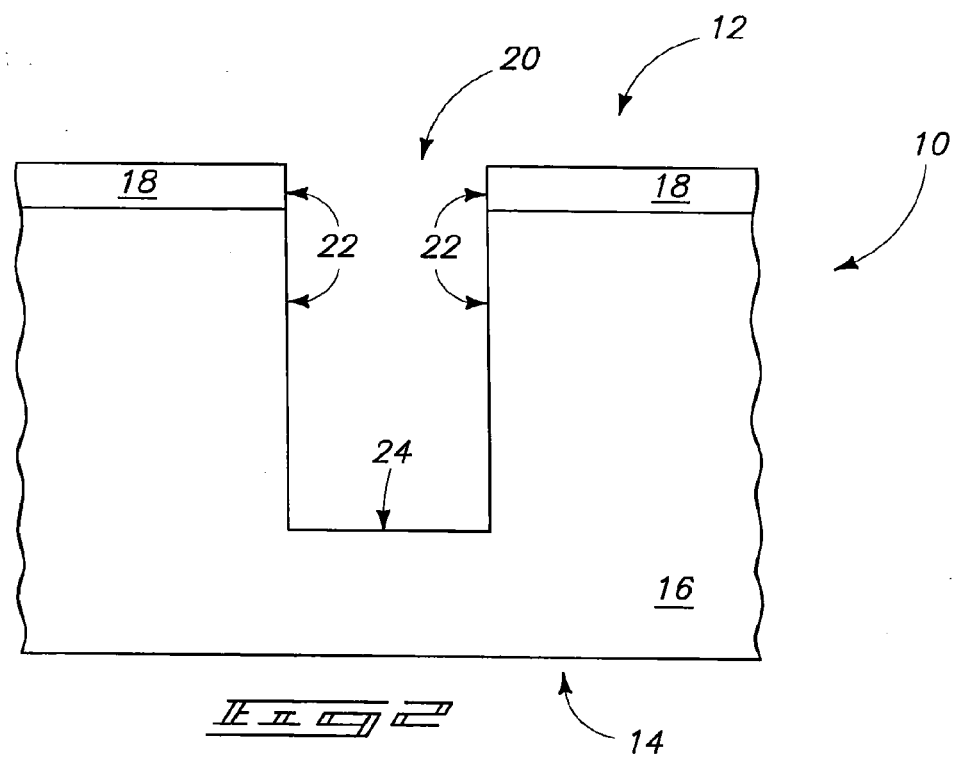

Referring to FIG. 2, a via 20 has been formed through passivation dielectric 18 and into semiconductive material of substrate 10 from side 12. Such may comprise a through via at this point or subsequent in the processing. In the context of this document, a "through via" is at some point a passageway extending from a substrate back-side to at least proximate a substrate front-side for ultimate conductive connection with one or more circuit devices on the front-side or with another substrate received over/proximate the front-side. For purposes of the continuing discussion, via 20 can be considered as comprising sidewalls 22 and a base 24. FIG. 2 also depicts via 20 as only being formed partially through substrate 10, although formation of via 20 completely through substrate 10 might also be utilized. Further, substrate 10 might be thinned by polishing or other action prior to or after forming via 20, and regardless of whether via 20 extends partially or completely through substrate 10. By way of examples only, cross-sectional configurations for via 20 are circular or oval, having an example minimum diameter/cross-dimension of from about 5 microns to about 70 microns.

Figure 3:
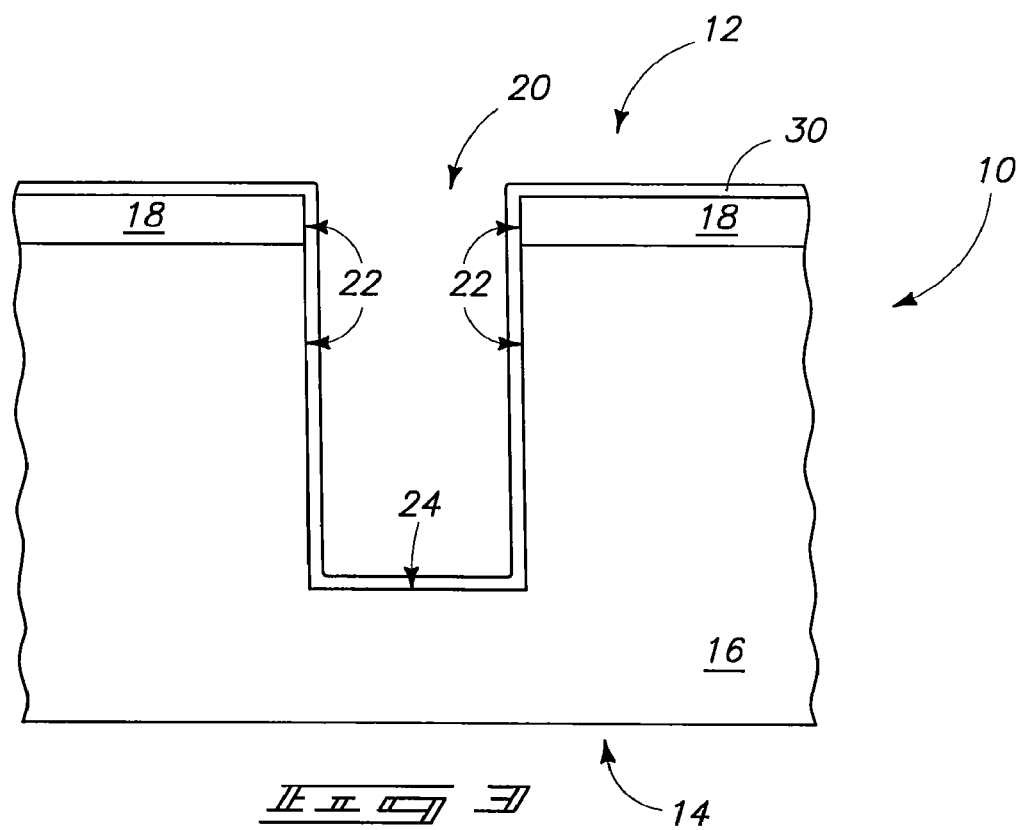

Referring to FIG. 3, a liquid dielectric 30 has been applied over passivation dielectric 18 and into via 20 to line at least an elevationally outermost portion of via sidewalls 22 relative substrate side 12 from which via 20 was at least initially formed. In one embodiment and as shown, the application of a liquid dielectric 30 lines all of sidewalls 22 of via 20 with liquid dielectric 30, and completely covers base 24 of via 20 with liquid dielectric 30. Alternately by way of example only, liquid dielectric 30 may line only an elevationally outermost portion of sidewalls 22 relative substrate side 12, for example only 5%, 25%, 50%, 75%, etc. of the outermost elevational length of sidewalls 22 of via 20. Further by way of example only, liquid dielectric 30 might be applied to line all of sidewalls 22 yet only a portion of via base 24, or only a portion of sidewalls 22 and none of via base 24. In one embodiment, the application of liquid dielectric lines all sidewalls of at least passivation dielectric 18 of via 20 with dielectric material 30.

In one embodiment, the application of liquid dielectric lines at least an elevationally outermost portion of semiconductive material sidewalls of via 20 inward of passivation dielectric 18 with liquid dielectric 30, for example where substrate side 12 is the back-side and semiconductor region 16 immediately adjacent passivation dielectric 18 comprises bulk semiconductor material, for example silicon.

In one embodiment, the liquid dielectric 30 comprises a liquid polymer, and regardless in one embodiment comprises a spin-on dielectric applied over substrate side 12 in a spin-on manner, and whether by an existing method or a yet-to-be developed method. However, any suitable flowable dielectric is contemplated whether existing or yet-to-be developed, and whether provided onto substrate 10 by spin-on or other technique. Example materials are JSR WPR-S170P available from JSR Corporation of Tokyo, Japan, CRC-7561 available from Sumitomo Bakelite of Tokyo, Japan, and SINR-3150HSM from Shin-Etsu MicroSi of Phoenix, Ariz. Of course, solvent or other material might be added to provide a desired viscosity, and various spin coating times and rpms might be utilized where spin coating is used to achieve desired degree of covering of liquid dielectric 30 relative to one or both via sidewalls 22 and via base 24. Spin-on dielectric application may be desirable to take advantage of simpler and lower cost existing such techniques without requiring vacuum processing.

Liquid dielectric 30 within via 20 is solidified, and conductive material is formed within via 20 over solidified dielectric 30 and a through substrate interconnect is formed with the conductive material. The solidifying is effective to adhere and cease flow of material 30 relative to substrate 16/18, and may include one or more elevated temperature baking steps to drive solvent from material 30 as part of ultimate solidification. Further and by way of example only, application of liquid dielectric 30 to a desired thickness and coverage relative to all or portions of sidewalls 22 and/or base 24 might occur or be conducted in a single liquid dielectric application step, or in multiple separate liquid dielectric application steps which may or may not include one or more elevated baking steps in between separate spaced liquid applications.

Figure 4:
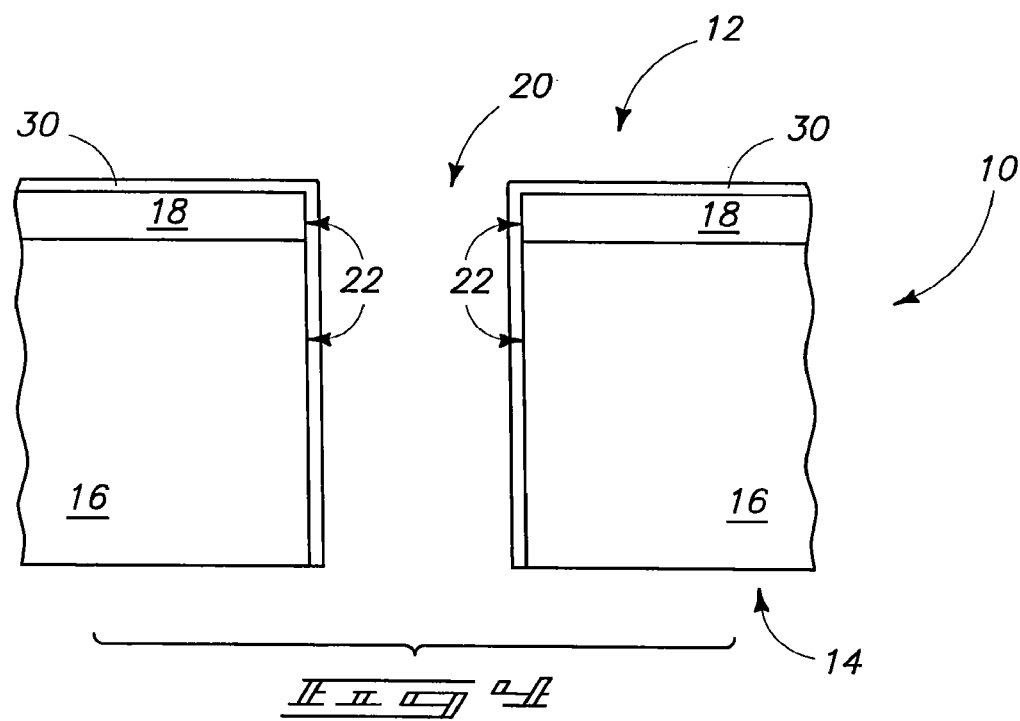

By way of example only, FIGS. 4 and 5 depict subsequent processing of the FIG. 3 substrate. Referring to FIG. 4, substrate 10 has been subjected to example substrate-side 14 polishing to effectively thin substrate 10 at least to a point of exposing via 20. Thereby in one example, via 20 extends completely through substrate 10 from substrate side 12 to substrate side 14. Prior to the thinning depicted by FIG. 4, and by way of example only, solidified dielectric 30 might be subjected to an anisotropic etch to remove material 30 from being received over passivation dielectric 18 and from over via base 24 (not shown).

Referring to FIG. 5, conductive material 32 has been formed within via 20, and a through substrate interconnect 35 has been formed therewith. Example materials 32 include any conductive material, including conductively doped semiconductive materials, elemental metals, alloys of elemental metals, and/or conductive metal compounds, including any combinations thereof. In one embodiment, a method of forming a through substrate interconnect is conducted to be void of using any chemical vapor deposition of any dielectric material to within via 20.

FIGS. 4 and 5 depict one embodiment wherein example polishing of substrate side 14 occurred prior to forming of conductive material within via 20. Such could of course be reversed wherein some or all of conductive material 32 is deposited within via 20 of the FIG. 3 substrate prior to the example polishing of FIG. 4.

The above-described embodiments are by way of example only, and depict forming via 20 initially only partially into substrate 10, and including removing material of the substrate from an opposing side from which the via was initially formed to extend the via completely through the substrate from one substrate side 12 to the other substrate side 14. Such might be conducted regardless of whether substrate side 12 comprises the substrate back-side or substrate side 14 comprises the substrate back-side. By way of example only, an alternate embodiment semiconductor substrate 10*a* is next described in conjunction with processing associated with FIGS. 6-8. Like numerals from the first-described embodiment are utilized where appropriate, with differences being indicated with the suffix "a" or with different numerals. In one embodiment, semiconductor substrate 10*a* can be considered as having substrate side 12 being the back-side, and substrate side 14 as being the substrate front-side. In one embodiment, semiconductor substrate 10*a* can be considered as having substrate side 12 being the front-side, and substrate side 14 as being the substrate back-side. FIG. 6 depicts substrate side 14 as comprising a conductive bond pad 36, which is thereby depicted as being more proximate substrate side 14 than substrate side 12. Bond pad 36 can be considered as comprising a back-side 38. Via 20*a* has been formed to conductive bond pad 36 from side 12. Such might be formed partially into bond pad 36 or to extend completely therethrough (not shown). FIG. 6 depicts via 20*a* extending to essentially stop on via back-side 38. A liquid dielectric 30*a* has been applied to line at least an elevationally outermost portion of sidewalls 22 of via 20*a*. The FIG. 6 embodiment also depicts application of liquid dielectric 30*a* over back-side 38 of bond pad 36.

Referring to FIG. 7, liquid dielectric 30*a* has been solidified and subjected to any suitable anisotropic etch which removes material 30*a* from being received elevationally outward of passivation dielectric 18 and from over back-side 38 of bond pad 36.

Referring to FIG. 8, conductive material 32*a* has been formed within via 20*a* and a through substrate interconnect 35*a* has been formed therewith. Material composition may be as described in the above embodiments.

Additional embodiments are next described with reference to FIGS. 9-12 in connection with a semiconductor substrate 10*b*. Like numerals from the first-described embodiments are utilized where appropriate, with differences being indicated with the suffix "b" or with different numerals. Not all embodiments of the invention require deposit of a passivation dielectric layer over a semiconductor substrate. However when utilized, the above-depicted embodiments provide but examples where a passivation dielectric layer is deposited over the side of the substrate from which the via is formed before forming the via, and then forming the via through the passivation dielectric layer. FIGS. 9-12 depict an embodiment wherein a passivation dielectric layer is deposited over the side of the substrate from which the via is at least initially formed after initially forming the via.

Referring to FIG. 9, a via 20*b* has been formed into semiconductive material of semiconductor substrate 10*b* from substrate side 12. Liquid dielectric 30*b* has been applied to line at least an elevationally outermost portion of sidewalls 22 of via 20*b*, for example using any of the materials, manners and resultant constructions as described with the above embodiments.

Referring to FIG. 10, liquid dielectric 30*b* has been solidified within via 20*b*, and a passivation dielectric 18*b* has been formed over substrate side 12 and at least partially over via 20*b*. In one embodiment and as shown, passivation dielectric 18*b* is formed over all of via 20*b*. In one embodiment and as shown, passivation dielectric 18*b* extends to within via 20*b* at least to some degree. In another embodiment, none of the passivation dielectric layer extends to within the via, for example bridging partially or wholly thereover without any lower portion thereof extending therein (not shown).

Figure 11:
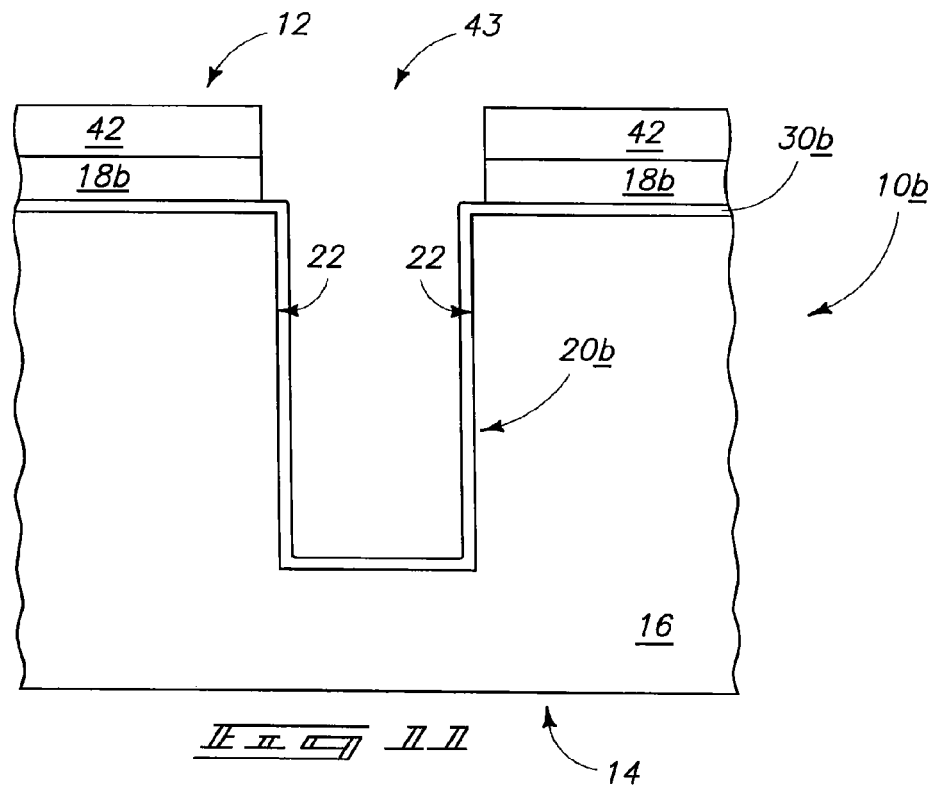
Figure 12:
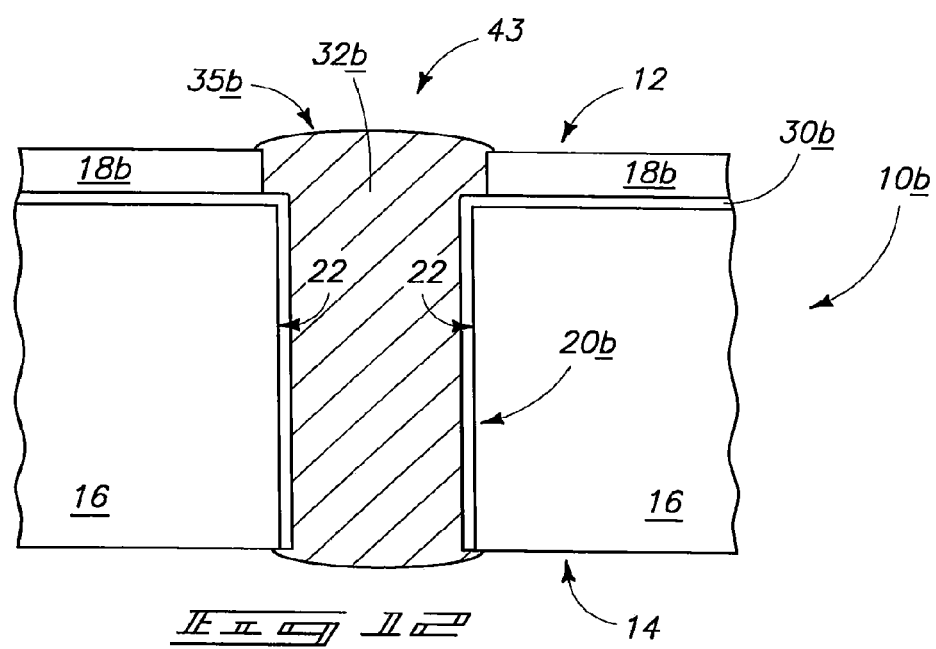

In one embodiment, the passivation dielectric layer is removed from over the via (and in one embodiment from being over and within the via), and conductive material is formed within the via over the solidified dielectric and a through substrate interconnect is formed therewith. FIGS. 11 and 12 depict one such example manner of doing so. For example, FIG. 11 depicts formation of a mask 42 over passivation dielectric 18*b*. By way of example only, an example masking material is photoresist that is patterned using photolithographic techniques. Further, layers 42 and 18*b* might be of the same composition, for example photosensitive polyimide. Regardless, mask 42 is depicted as comprising an opening 43 therethrough to via 20*b*, and passivation dielectric 18*b* has been etched through opening 43 to be removed from over and from within via 20*b*.

Referring to FIG. 12, masking 42 (not shown) has been removed, and conductive material 32*b* has been formed within via 20*b* and a through substrate interconnect 35*b* has been formed with conductive material 32*b*. Alternately by way of example only, masking material 42 in one embodiment might remain as part of substrate 10*b* (not shown). Materials, methods, and constructions may be as described with any of the above embodiments. For example and by way of example only, FIG. 12 depicts thinning of substrate 10*b* from substrate side 14 to expose via 20*b* prior to formation of conductive material 32*b* within via 20*b*. Any alternate methods are contemplated, including by way of example that described above generally in connection with FIG. 1-8.

Additional embodiments are next described in connection with FIGS. 13-17 with respect to a semiconductor substrate 10*d*. Like numerals from the above-described embodiments are utilized where appropriate, with differences being indicated with the suffix "d" or with different numerals. The above-described examples do not require, and may be void of, any vapor deposition of dielectric material to line any portion of the depicted via after its formation. However, certain embodiments of the invention do contemplate some combination of vapor depositing of a dielectric material within a via in the fabrication of a through substrate interconnect in combination with some application of a liquid dielectric within a via in the fabrication of a through substrate interconnect. For example and by way of example only, existing and yet-to-be developed vapor deposition methods might be better capable of lining through vias having very high aspect ratios as compared to existing and yet-to-be developed liquid dielectric application techniques. In such and other instances, it might be desirable to use a combination of vapor depositing of dielectric material and liquid application of dielectric within through vias in the fabrication of through substrate interconnects. By way of example and not of limitation, another reason for doing so might be to provide vapor deposited dielectric at the base of a via while providing a liquid dielectric proximate the via opening top which has a solidified coefficient of thermal expansion which is between that of the passivation dielectric layer and the vapor deposited dielectric.

Figure 13:
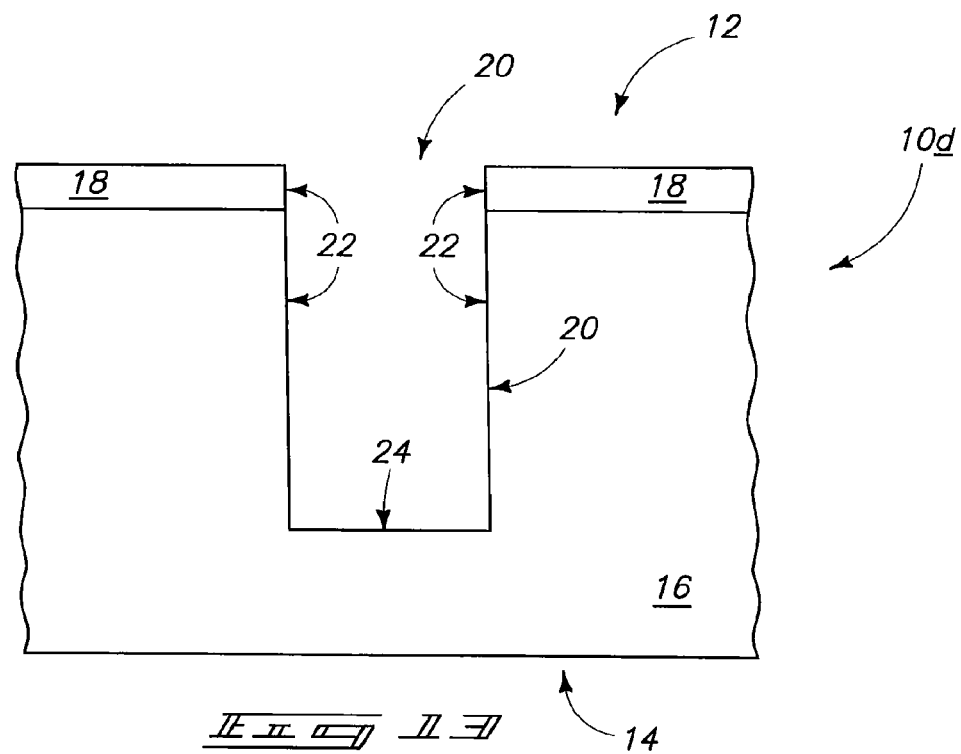
FIG. 13 is a diagrammatic sectional view of another semiconductor substrate in process in accordance with an embodiment of the invention.

Referring to FIG. 13, a passivation dielectric 18 has been formed over substrate side 12 of semiconductor substrate 10*d*. A via 20 has been formed through passivation dielectric 18 and into semiconductive material of substrate 10*d* from substrate side 12.

Figure 14:
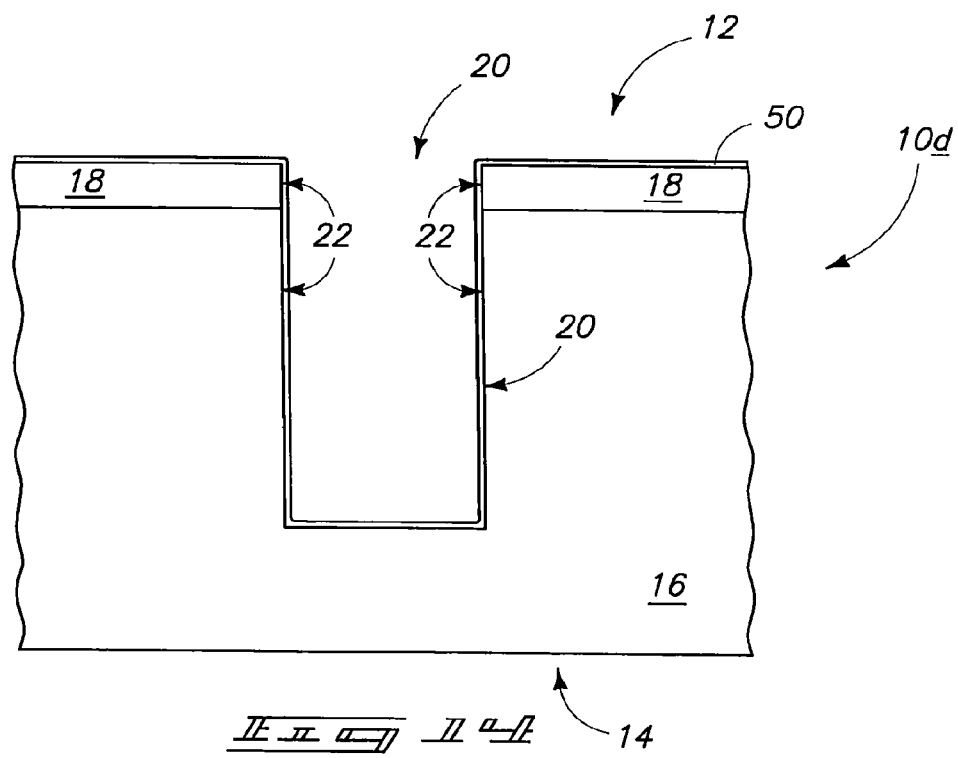

Referring to FIG. 14, a dielectric material 50 has been vapor deposited over passivation dielectric 18 to line at least an elevationally outermost portion of sidewalls 22 of via 20. Any suitable dielectric material 50 might be used. In one embodiment, the vapor depositing comprises chemical vapor depositing, and in one embodiment comprises pulsed chemical vapor depositing. One example dielectric material 50 comprises aluminum oxide, although other materials in combination with or exclusive of aluminum oxide are also of course contemplated. Dielectric material 50 might be deposited to completely line all of via sidewalls 22 as shown, or only at least an elevationally outermost portion thereof. An example thickness for vapor deposit dielectric material 50 is from about 0.1 micron to about 1 micron.

Dielectric material 50 might be recessed (for example by etching) to within the via, for example to be at or below the passivation dielectric. For example referring to FIG. 15, dielectric material 50 has been recessed to below the base of passivation dielectric 18 within via 20. In one embodiment, such recessing is conducted without any masking over substrate 10. In one embodiment, the recessing of dielectric material 50 within via 20 is such that it is received at least 2 microns elevationally inward of the base of passivation dielectric 18. Alternately by way of example only, the dielectric material 50 might be recessed to have its top coincide with the base of passivation dielectric 18 (not shown) or received elevationally outward thereof (not shown). Regardless in the depicted embodiment, such recessing of dielectric material 50 is shown as also effectively clearing it from being received atop passivation dielectric 18 and from over base 24 of via 20 between sidewall-received portions of dielectric material 50.

Figure 16:
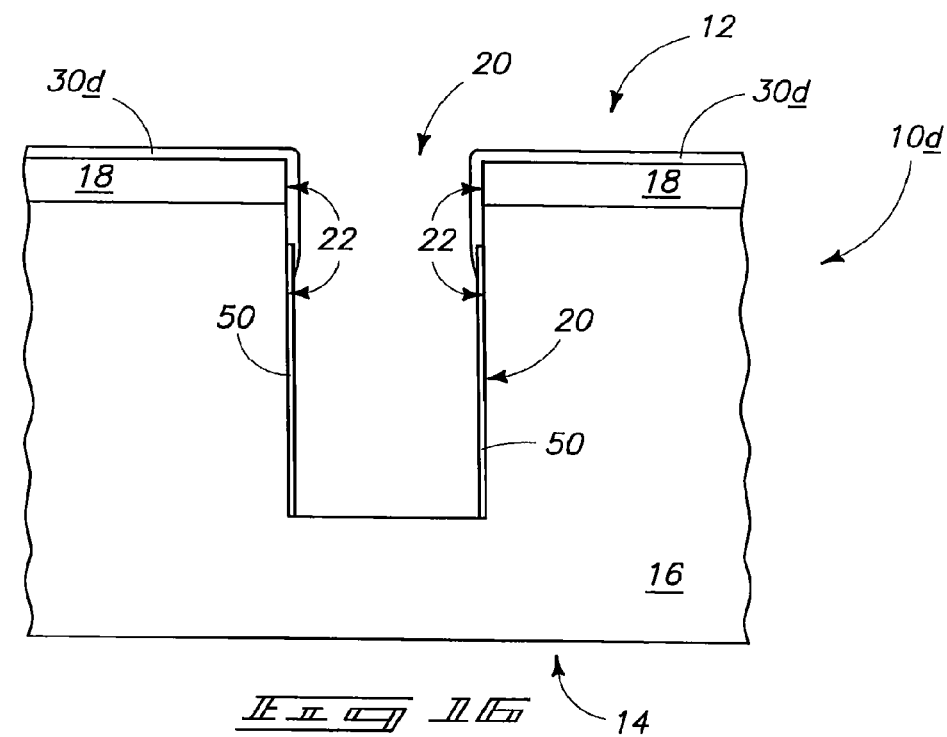

Referring to FIG. 16, liquid dielectric 30d has been applied over passivation dielectric 18 into via 20 at least to line an elevationally outermost portion of sidewalls 22 of via 20 above recessed dielectric material 50 and to be received over at least an elevationally outermost portion of recessed dielectric material 50 received within via 20. Example liquid dielectric materials and methods of application are as described above. Liquid dielectric 30d might be applied to completely cover over sidewalls of vapor deposited dielectric material 50 (not shown), or only partially received over an elevationally outermost portion thereof (as shown). Further, liquid dielectric material 30d may or may not cover any portion of via base 24.

The liquid dielectric is solidified within the via, and conductive material is formed therewithin over the solidified dielectric and a through substrate interconnect is formed with the conductive material. One example resultant construction is depicted in FIG. 17 in conjunction with conductive material 32d in the fabrication of a through substrate interconnect 35d. Of course, any of the above-described attributes, methods, constructions, and materials might be used or alternately be formed.

In one embodiment, passivation dielectric 18 and dielectric material 50 are formed to have different coefficients of thermal expansion, with liquid dielectric 30d being solidified to have a coefficient of thermal expansion which is between those of passivation dielectric 18 and vapor deposited dielectric material 50. In one embodiment, liquid dielectric 30d is solidified to have a low Young's Modulus of less than or equal to approximately 2.0 GPa.

Figure 15:
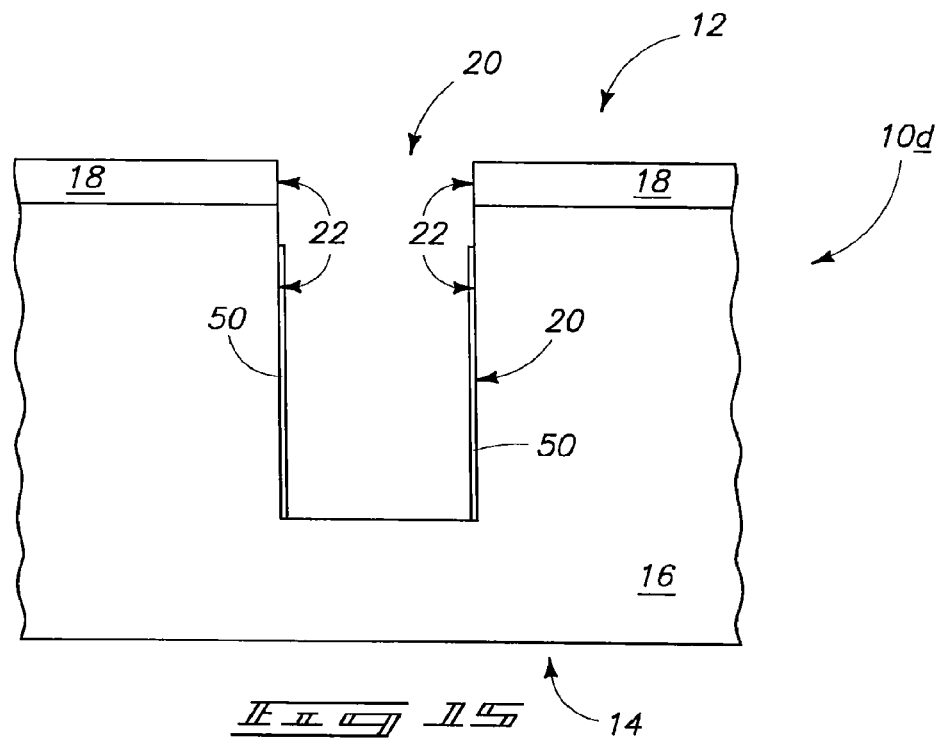

The above-described embodiment was in conjunction with conducting a recess etch of vapor deposited material 50 in going from the substrate depiction of FIG. 14 to that of FIG. 15. An alternate embodiment contemplates little or no etching of vapor deposited dielectric material 50, for example as shown in a resultant construction in FIG. 18 in conjunction with a semiconductor substrate 10e. Like numerals from the first-described embodiment are utilized where appropriate, with differences being indicated with the suffix "e" or with different numerals. FIG. 18 depicts vapor deposited dielectric material 50e as not having been recessed within via 20 prior to application and solidification of liquid dielectric 30e. Materials and manners of processing and construction can otherwise be as described in connection with all of the above embodiments.

Figure 19:
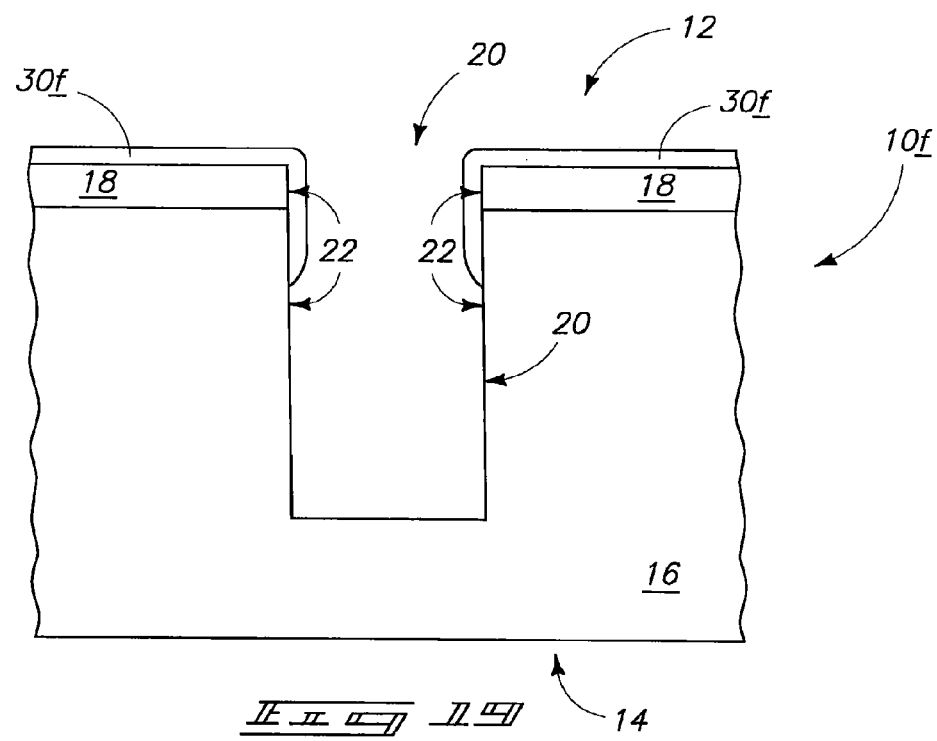
FIG. 19 is a diagrammatic sectional view of another semiconductor substrate in process in accordance with an embodiment of the invention.
Figure 20:
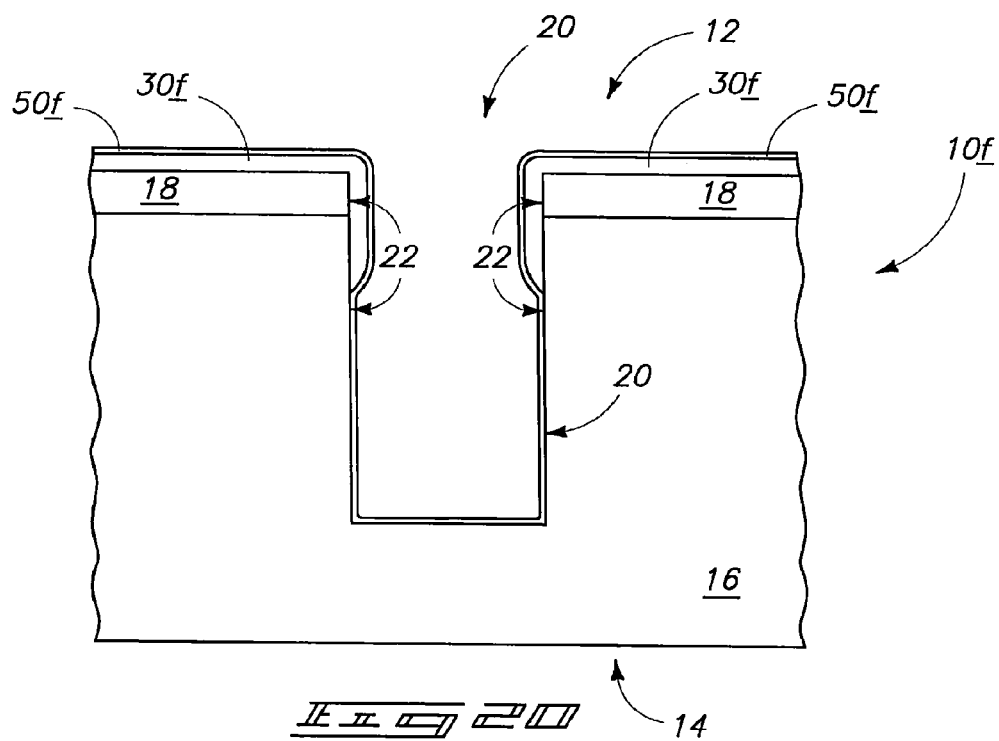

Additional embodiment methods of forming through substrate interconnects are next described with reference to FIGS. 19-21 with respect to a semiconductor substrate 10f. Like numerals from the first-described embodiment are utilized where appropriate, with differences being indicated with the suffix "f" or with different numerals. The above-described example FIGS. 13-18 embodiments applied a liquid dielectric after forming a vapor deposited dielectric within a through via. FIGS. 19-21 depict an alternate embodiment wherein a vapor deposited dielectric material is formed after application and solidification of a liquid dielectric material. Specifically and by way of example only, FIG. 19 depicts formation of a passivation dielectric 18 over substrate side 12, and a via 20 therethrough and into semiconductive material of substrate 10f from substrate side 12. A liquid dielectric 30f has been applied over passivation dielectric 18 and into via 20 to line only an elevationally outermost portion of sidewalls 22 of via 20. In one embodiment, such lines no more than 50% of a combined elevational height/thickness of via 20 within passivation dielectric 18 and the depicted substrate region 16.

Referring to FIG. 20, liquid dielectric 30f is solidified and a dielectric material 50f is vapor deposited to within via 20 over solidified dielectric 30f and to line over sidewall portions 22 of via 20 that are received elevationally inward of solidified dielectric 30f within via 20. In the depicted embodiment, dielectric material 50f is completely covering of all sidewalls 22 of via 20, and also covering of all of base 24 of via 20, although such is not required. Conductive material is ultimately formed within via 20 over the vapor deposited dielectric material and solidified dielectric to form a through substrate interconnect, for example as shown in FIG. 21 of material 32f to form a through substrate interconnect 35f. Example materials, methods of construction, attributes, and other parameters can additionally or alternately be as described above. For example in one implementation, solidified spin-on dielectric 30f may be provided to have a coefficient of thermal expansion which is between that of passivation dielectric layer 18 and dielectric material 50f.

Again, all processing as described above might occur in connection with either a front-side or rear-side of a semiconductor substrate as above-defined.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a through substrate interconnect, comprising:
   forming a passivation dielectric over a back-side of a semiconductor substrate;
   after forming the passivation dielectric, etching through the passivation dielectric and then into semiconductive material of the substrate from the substrate back-side to form a via;

applying a liquid dielectric over the passivation dielectric and into the via to line only an elevationally outermost portion of sidewalls of the via;

solidifying the liquid dielectric within the via;

vapor depositing a dielectric material to within the via to line over the solidified dielectric within the via and to line over sidewall portions of the via received elevationally inward of the solidified dielectric within the via; and forming conductive material within the via over the vapor deposited dielectric material and forming a through substrate interconnect with the conductive material.

2. The method of claim 1 wherein the liquid and solidified dielectric within the via lines no more than 50% of a combined elevational thickness of the passivation dielectric and the semiconductive material that forms the via.

3. The method of claim 1 wherein the solidified dielectric is thicker than the vapor deposited dielectric material.

4. The method of claim 1 wherein the liquid dielectric has a solidified coefficient of thermal expansion which is between that of the passivation dielectric and the vapor deposited dielectric.

5. The method of claim 1 wherein the vapor deposited dielectric material completely covers all sidewalls of the via elevationally inward of the solidified dielectric that is within the via.

6. The method of claim 5 wherein the via has a base, the vapor deposited dielectric material completely covering all of the via base.

7. The method of claim 6 wherein the liquid dielectric has a solidified coefficient of thermal expansion which is between that of the passivation dielectric and the vapor deposited dielectric.

8. The method of claim 1 wherein the via has a base, the vapor deposited dielectric material not completely covering at least one of a) all sidewall of the via, and b) all of the base.

9. A method of forming a through substrate interconnect, comprising:

forming a passivation dielectric over a front-side of a semiconductor substrate;

after forming the passivation dielectric, etching through the passivation dielectric and then into semiconductive material of the substrate from the substrate front-side to form a via;

applying a liquid dielectric over the passivation dielectric and into the via to line only an elevationally outermost portion of sidewalls of the via;

solidifying the liquid dielectric within the via;

vapor depositing a dielectric material to within the via to line over the solidified dielectric within the via and to line over sidewall portions of the via received elevationally inward of the solidified dielectric within the via; and forming conductive material within the via over the vapor deposited dielectric material and forming a through substrate interconnect with the conductive material.

10. The method of claim 9 wherein the liquid and solidified dielectric within the via lines no more than 50% of a combined elevational thickness of the passivation dielectric and the semiconductive material that forms the via.

11. The method of claim 9 wherein the solidified dielectric is thicker than the vapor deposited dielectric material.

12. The method of claim 9 wherein the liquid dielectric has a solidified coefficient of thermal expansion which is between that of the passivation dielectric and the vapor deposited dielectric.

13. The method of claim 9 wherein the vapor deposited dielectric material completely covers all sidewalls of the via elevationally inward of the solidified dielectric that is within the via.

14. The method of claim 13 wherein the via has a base, the vapor deposited dielectric material completely covering all of the via base.

15. The method of claim 14 wherein the liquid dielectric has a solidified coefficient of thermal expansion which is between that of the passivation dielectric and the vapor deposited dielectric.

16. The method of claim 9 wherein the via has a base, the vapor deposited dielectric material not completely covering at least one of a) all sidewall of the via, and b) all of the base.

* * * * *